United States Patent

Pope et al.

(10) Patent No.: US 10,210,286 B1
(45) Date of Patent: *Feb. 19, 2019

(54) SYSTEMS AND METHODS FOR DETECTING CURBS IN THREE-DIMENSIONAL POINT CLOUDS DESCRIPTIVE OF STREETS

(71) Applicant: Google LLC, Mountain View, CA (US)

(72) Inventors: Arthur Robert Pope, Palo Alto, CA (US); Ioannis Stamos, Brooklyn, NY (US)

(73) Assignee: Google LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/856,527

(22) Filed: Dec. 28, 2017

Related U.S. Application Data

(63) Continuation of application No. 14/551,502, filed on Nov. 24, 2014, now Pat. No. 9,870,437.

(51) Int. Cl.
*G06F 17/50* (2006.01)
*G06T 17/05* (2011.01)

(52) U.S. Cl.
CPC .......... *G06F 17/5004* (2013.01); *G06T 17/05* (2013.01); *G06T 2210/56* (2013.01)

(58) Field of Classification Search
CPC ......... G06T 19/00; G06T 17/20; G06T 17/00; G06T 15/10; G06T 15/00
See application file for complete search history.

(56) References Cited

U.S. PATENT DOCUMENTS

| | | | |
|---|---|---|---|
| 8,364,334 B2 | 1/2013 | Au et al. | |
| 9,383,753 B1* | 7/2016 | Templeton | G05D 1/0246 |
| 9,870,437 B2* | 1/2018 | Pope | G06F 17/5004 |
| 2005/0216237 A1 | 9/2005 | Adachi et al. | |
| 2013/0096886 A1 | 4/2013 | Vorobyov et al. | |
| 2013/0169685 A1 | 7/2013 | Lynch | |
| 2013/0202197 A1 | 8/2013 | Reeler et al. | |

(Continued)

FOREIGN PATENT DOCUMENTS

WO    WO/2013175022    11/2013

OTHER PUBLICATIONS

Hadjiliadis et al., "Sequential Classification in Point Clouds of Urban Scenes", 5th International Symposium on 3D Data Processing, Visualization and Transmission, Paris, France, May 17-20, 2010, 8 pages.

(Continued)

*Primary Examiner* — Todd Buttram
(74) *Attorney, Agent, or Firm* — Dority & Manning, P.A.

(57) ABSTRACT

Computer-implemented methods and systems of detecting curbs include receiving a cloud of three-dimensional (3D) data points acquired along street locations. A plurality of vertical scanlines (e.g., arrays of 3D data points obtained at given horizontal locations) are identified within the cloud of 3D data points. One or more curb points indicating the potential presence of a curb in the plurality of vertical scanlines are identified. A synthesized set of non-overlapping curb curves are generated in order to close gaps between certain curb points while removing certain other outlier curb points. Successive curb curves in the synthesized set of non-overlapping curb curves are then identified as belonging to one or more curb segments.

20 Claims, 9 Drawing Sheets

(56) References Cited

U.S. PATENT DOCUMENTS

2014/0160244 A1\* 6/2014 Berberian .......... G06K 9/00798
                                                  348/46
2016/0147915 A1\* 5/2016 Pope ................... G06F 17/5004
                                                  703/1

OTHER PUBLICATIONS

Huang et al., "Lane Boundary and Curb Estimation with Lateral Uncertainties", International Conference on Intelligent Robots and Systems, St. Louis, Missouri, Oct. 11-15, 2009, pp. 1729-1734.

Huang, "Lane Estimation for Autonomous Vehicles Using Vision and LIDAR", (Doctoral Dissertation), Massachusetts Institute of Technolgoy, Feb. 2010, 114 pgs.

Kodagoda et al., "CuTE: Curb Tracking and Estimation", IEEE Transactions on Control Systems Technology, vol. 14, No. 5, Sep. 2005, pp. 951-957.

Siegemund et al., "A Temporal Filter Approach for Detection and Reconstruction of Curbs and Road Surfaces Based on Conditional Random Fields", IEEE Intelligent Vehicles Symposium, Kongresshaus Baden-Baden, Germany, Jun. 5-9, 2011, pp. 637-642.

Wang et al., "Lane Detection and Tracking Using B-Snake", Image and Vision Computing, vol. 22, Apr. 2004, pp. 269-280.

Wijesoma et al., "Road Curb Tracking in an Urban environment", International Conference on Information Fusion, Queensland, Australia, Jul. 8-11, 2003, pp. 261-268.

Zhao et al., "Curb Detection and Tracking Using 3D-LIDAR Scanner", 19$^{th}$ IEEE International Conference on Image Processing, Lake Buena Vista, Florida, Sep. 30-Oct. 3, 2012, pp. 437-440.

\* cited by examiner

US 10,210,286 B1

SYSTEMS AND METHODS FOR DETECTING CURBS IN THREE-DIMENSIONAL POINT CLOUDS DESCRIPTIVE OF STREETS

FIELD

The present disclosure relates generally to processing of three-dimensional point clouds, and more particularly to systems and methods for detecting curbs in three-dimensional point clouds descriptive of streets, such as, for example, three-dimensional LIDAR point cloud data collected, for example, by a motorized scanning vehicle.

BACKGROUND

Accurate detection of curbs in complex urban streets can be challenging due to the high volume of static and/or dynamic objects (e.g., cars, people, buildings, street signs, vegetation, decorative structures, etc.) located at or near curb locations. For instance, mobile sensors such as, for example, LIDAR systems, used to obtain data may not be able to sense curbs when occluding objects are positioned between the sensors and the curbs. The occluding objects also may cause reflections or distortions when obtaining data. Changes in the speed and distance of the mobile sensors may also pose low resolution or varied resolution processing challenges.

SUMMARY

Aspects and advantages of embodiments of the present disclosure will be set forth in part in the following description, or may be learned from the description, or may be learned through practice of the embodiments.

One example aspect of the present disclosure is directed to a computer-implemented method of detecting curbs. The method can include receiving, by one or more computing devices, a cloud of three-dimensional (3D) data points acquired along one or more street locations. The method can further include identifying, by the one or more computing devices, a plurality of vertical scanlines within the cloud of 3D data points, each vertical scanline comprising an array of 3D data points obtained at a given horizontal location along the one or more street locations. The method can still further include identifying, by the one or more computing devices, one or more curb points in the plurality of vertical scanlines. The one or more curb points indicate the potential presence of a curb along the one or more street locations. The method can still further include generating, by the one or more computing devices, a synthesized set of non-overlapping curb curves based at least in part on the identified one or more curb points in nearby vertical scanlines. The synthesized set of non-overlapping curb curves closes gaps between one or more of the identified curb points. The method can still further include identifying, by the one or more computing devices, successive curb curves in the synthesized set of non-overlapping curb curves as belonging to one or more curb segments.

Other example aspects of the present disclosure are directed to systems, apparatus, tangible, non-transitory computer-readable media, user interfaces, memory devices, and electronic devices for detecting curb curves.

These and other features, aspects, and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
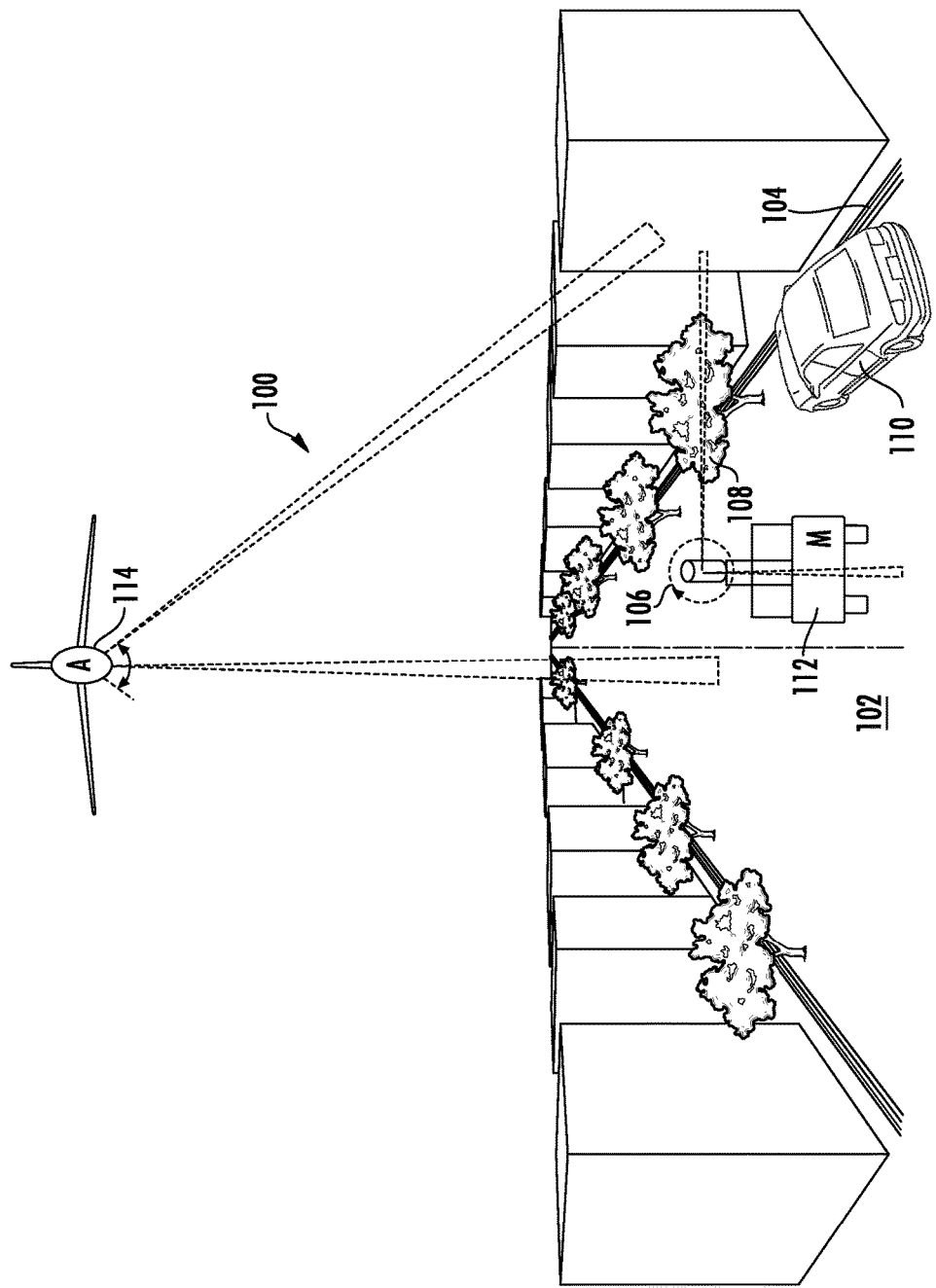
FIG. 1 depicts example mobile acquisition units for gathering data according to example aspects of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Overview

Example aspects of the present disclosure are directed to systems and methods for detecting and modeling curb curves in complex urban scenes including one or more street locations. Accurate detection and modeling of curb curves in complex urban environments can be challenging due to the high volume of static and/or dynamic objects (e.g., cars, people, buildings, street signs, vegetation, decorative structures, etc.) located at or near curb locations. For instance, mobile sensors used to obtain curb modeling data may not be able to sense curbs when occluding objects are positioned between the sensors and the curbs. The occluding objects also may cause reflections or distortions when obtaining curb data. Changes in the speed and distance of the mobile sensors may also pose low resolution or varied resolution processing challenges. Accurate curb modeling also may be affected by sensor noise and local similarity among curbs and other detected objects.

In light of the unique challenges that can arise in detecting and modeling curb curves along urban street locations, the disclosed embodiments provide features for efficient and accurate processing of acquired curb data. Specific algorithms are implemented to verify and integrate local curb point detections into a complete curb, while handling missed detections and false detections in a manner that reduces the effect on overall curb detection accuracy. Improved 3D models resulting from implementation of the disclosed features and algorithms are useful for general reference and analysis of urban scenes.

Accurate curb modeling according to the disclosed embodiments can provide the context for object classification, sign interpretation, improved mapping operations, object alignment and real-time navigation cues for automated and/or assisted driving applications. For example, accurately detected presence of a curb can help assist with identification of other detected objects such as buildings, which are more likely present along a street location beyond a curb as opposed to in the middle of an intersection. Accurately detected absence of a curb can help assist with identification of objects such as streetlights or provision of more accurate directions or instructions based on the identified transition from curb to intersection.

The disclosed embodiments can provide other various benefits. For instance, curb detection can be provided in a functional manner in highly cluttered environments, such as centers of urban cores. Robust features can handle large occlusions by using multiple data cues to decide whether to connect disconnected segments of curb data. Moreover, curb detection can be implemented according to the disclosed embodiments without requiring dense 3D scans of an analyzed scene. Although curb detection is typically easier with densely sampled scene data, acquisition of such data sets is often unrealistic. For example, when scene data is dynamically acquired by a moving data acquisition unit, the input often consists of a set of scans having limited resolution and curbs that are not even visible by the human eye. Generation of an optimal set of models for fitting detected curb points can provide compact representations of curb curves, thus affording efficient storage, rendering and processing of a final curb modeling result.

Data analyzed according to example aspects of the present disclosure can include a cloud of three-dimensional (3D) data points. The data points can be obtained from any number of sources, including from pre-existing databases or from databases that are dynamically created through acquisition of data points in real-time from a mobile data acquisition unit mounted to a street-based transportation device, an aerial device, or other device. Mobile data acquisition units can include a combination of sensors or data acquisition devices, such as but not limited to cameras capable of acquiring two-dimensional (2D) photos or videos and laser scanners capable of acquiring terrestrial LIDAR data. The acquired clouds of 3D data points are subsequently defined in terms of a series of identified vertical scanlines, where each vertical scanline corresponds to an array of 3D points obtained at a given horizontal location.

In one example embodiment, curb points are identified in the plurality of vertical scanlines, indicating the potential presence of a curb along an analyzed street location. A synthesized set of non-overlapping curb curves is generated from the set of identified curb points by closing gaps between certain curb points. Other curb points may also be removed from the set after being identified as outliers. A determination then is made to identify successive curb curves as belonging to one or more curb segments. A curb model can be generated that fits the one or more curb segments to one or more curb model shape representations.

In some examples, curb points in the plurality of vertical scanlines can be identified by determining the slope and/or signed slope of data points within each vertical scanline. The determined slope then can be used to characterize each point as belonging to one of a set of classification types, for example, horizontal, vertical, and/or vegetation points. The slope and classification for each data point in a scanline then can be more particularly analyzed to identify potential curb points. In some examples, a curb point is identified by a transition within a vertical scanline from a horizontal point to a vertical point followed by a sequence of vertical points having a distance that is less than a predetermined maximum height for a curb. In other examples, a spike in the height difference among data points in each vertical scanline is identified as a curb point, where the height difference generally corresponds to the difference between vertical distance measurements obtained at successive scan points in each vertical scanline. In other examples, the height difference is analyzed using an optimal sequential cumulative sum (CUSUM) algorithm to identify potential curb points.

The identified curb points can be connected to other curb points in nearby vertical scanlines to create a synthesized set of non-overlapping curb curves. The synthesized set of non-overlapping curb curves can close small gaps and remove any outliers that may exist in the set of identified curb points. In some examples, a first curb point in a given vertical scanline is connected to a second curb point in another nearby vertical scanline that is within a predetermined distance of the first curb point.

Successive curb curves in the synthesized set of non-overlapping curb curves can be connected together to form one or more curb segments. Determination of which curb curves to connect involves determining whether breaks between curb curves are likely caused by vehicles and other occluding objects. When a gap between curb curves actually indicates a curb break due to a street cut, parking garage or other business or home entrance, and/or other legitimate curb break, then the gap between curb curves can remain.

One or more specific techniques can be used to make the determination about whether to connect successive curb curves into a given curb segment. In one example, the distance between endpoints of successive curb curves in the synthesized set of non-overlapping curb curves can be calculated and compared to a predetermined curb connection parameter. In some examples, the predetermined curb connection parameter is a variable dependent at least in part on the lane width of streets in the given urban environment. In some examples, a connecting curve (e.g., a B-spline curve) is generated to close the gap between successive curb curves. The number of vertical obstacles detected in front of the connecting curve and the number of vertical obstacles detected behind the connecting curve then can be used to make the determination about whether to connect the successive curb curves. The maximum curvature of the points within the connecting curve could additionally or alternatively be used in the determination. Still further example determinations involve calculating a first length between a first endpoint of a projection of the connecting curve and the endpoint of a normal of the first curb curve and calculating a second length between a second endpoint of a projection of the connecting curve and the endpoint of a normal of the second curb curve.

In generating a curb model, the curb curve data represented by the identified curb segments is fitted to a set of combined curb model shape representations. In some examples, application features attempt to fit portions of the curb segments to one or more standard curb model shape formats, such as 3D linear models, 3D circular models, 3D elliptical models, and the like. In other examples, when curb curve portions cannot be fitted adequately to a standard curb model shape representation, an alternative curb model shape representation is considered, such as a B-spline model. Intersection algorithms may also be implemented in generating a curb model such that adjacent curb curves within the same curb segment can be effectively connected together.

Once a final curb model is generated according to example aspects of the present disclosure, various user applications may utilize the curb curve model in further ways. In some examples, the curb model is used to classify objects identified within the same or other 3D point clouds along a street location. In other examples, the curb model is used to assist with 3D mapping. For example, the curb model may be used to generate at least one 3D model of the one or more street locations encompassing the curb. In other examples, the curb model and/or the at least one 3D model may be provided for display to a user. Still further applications of the present disclosure may use the curb detection and modeling results for different purposes.

According to an example embodiment, a mobile data acquisition unit provided on a transportation device acquires street level images and terrestrial LIDAR data that are used in various combinations to provide a cloud of three-dimensional (3D) data points along one or more street locations. Vertical scanlines within the collected data are analyzed to detect curbs and generate models of curb segments. Improved accuracy in the curb models is provided by connecting certain curb points into curb curves while addressing outlier data and connecting certain curb curves into curb segments even when large data sections are missing due to occluding objects. The resulting curb data improves modeling of geographic areas in a geographic information system, such as a mapping service or a virtual globe. The improved curb data also provides context to classify ground objects, to interpret language on nearby street signs, to align objects within 3D maps and models and/or provide real-time navigational information for automated and/or assisted driving applications.

Example Methods for Detecting and Modeling Curb Curves

FIG. 1 depicts an urban environment 100 that can include one or more street locations 102 along which one or more curbs 104 are located. A mobile data acquisition unit 106 may traverse the one or more street locations 102 in order to acquire data points for subsequent modeling of the urban environment 100. The disclosed embodiments can help detect a sequence of curb curves that model the sensed curb curves identified within the acquired data points. Features are provided for specific handling of curb detection in situations such as those shown in FIG. 1 when trees 108, cars 110 or other occluding objects may be blocking the curb 104 from the sensors located at mobile data acquisition unit 106. In these situations, data obtained by mobile data acquisition unit 106 may be limited and detection and modeling of the curbs 104 may require specific techniques as disclosed herein.

In some examples, mobile data acquisition unit 100 may be positioned relative to a street-based transportation device such as car 112 or other motorized vehicle. In other examples, mobile data acquisition unit 106 may be positioned relative to an aerial device 114. Multiple data acquisition units 106 could be used in some examples to obtain data sets used for detecting and modeling curbs in accordance with the disclosed embodiments. Mobile data acquisition units 106 can include a combination of sensors or data acquisition devices, such as but not limited to cameras capable of acquiring data points obtained from two-dimensional (2D) photos or videos and laser scanners capable of acquiring three-dimensional (3D) terrestrial LIDAR data. 3D LIDAR data generally is obtained with laser sensing components that measure distance to a target by illuminating the target with a laser and analyzing the reflected light. Combinations of 2D photos can be translated into 3D space and corresponding 3D data points using known photogrammetry and other imaging techniques. The acquired data points generally referenced by FIG. 1 can be processed according to example aspects of the present disclosure to detect and model curb curves.

Figure 2:
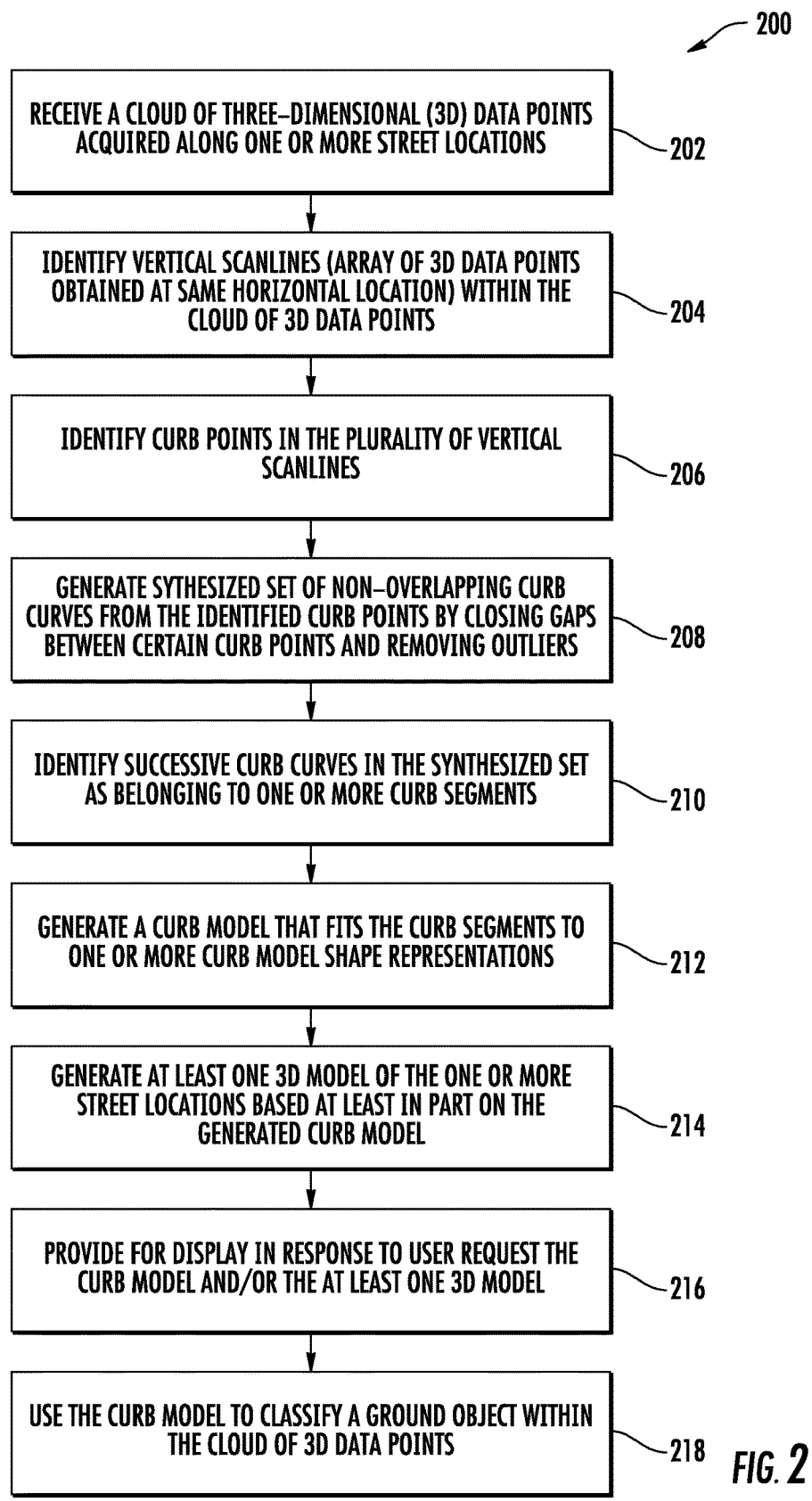
FIG. 2 provides a flow diagram of an example method of detecting curb curves according to example aspects of the present disclosure.

FIG. 2 depicts a flow diagram of an example method (200) for detecting and modeling curb curves according to example embodiments of the present disclosure. The method (200) can be implemented by one or more computing devices, such as one or more of the computing devices depicted in FIG. 12. In addition, FIG. 2 depicts steps performed in a particular order for purposes of illustration and discussion. Those of ordinary skill in the art, using the disclosures provided herein, should understand that the steps of any of the methods disclosed herein can be omitted, rearranged, expanded, adapted, and/or modified in various ways without deviating from the scope of the present disclosure.

Referring still to FIG. 2, the method (200) includes receiving at (202) a cloud of 3D data points acquired along one or more street locations, such as street locations 102 in FIG. 1. Vertical scanlines are identified at (204) within the cloud of 3D data points. A vertical scanline generally corresponds to a vertical array of 3D data points obtained at the same horizontal location. In some examples, the data acquisition units used to obtain the cloud of 3D data points are configured to initially obtain the data in the form of vertical scanlines by using multiple light sources configured in a vertically oriented array that acquire successive scanlines at relatively high frequencies as a mobile data acquisition unit moves along a given street location. In other examples where data may not be initially obtained in the form of vertical scanlines, 3D data can be separated into the form of vertical scanlines by processing the points or pixels within a data set.

Figure 3:
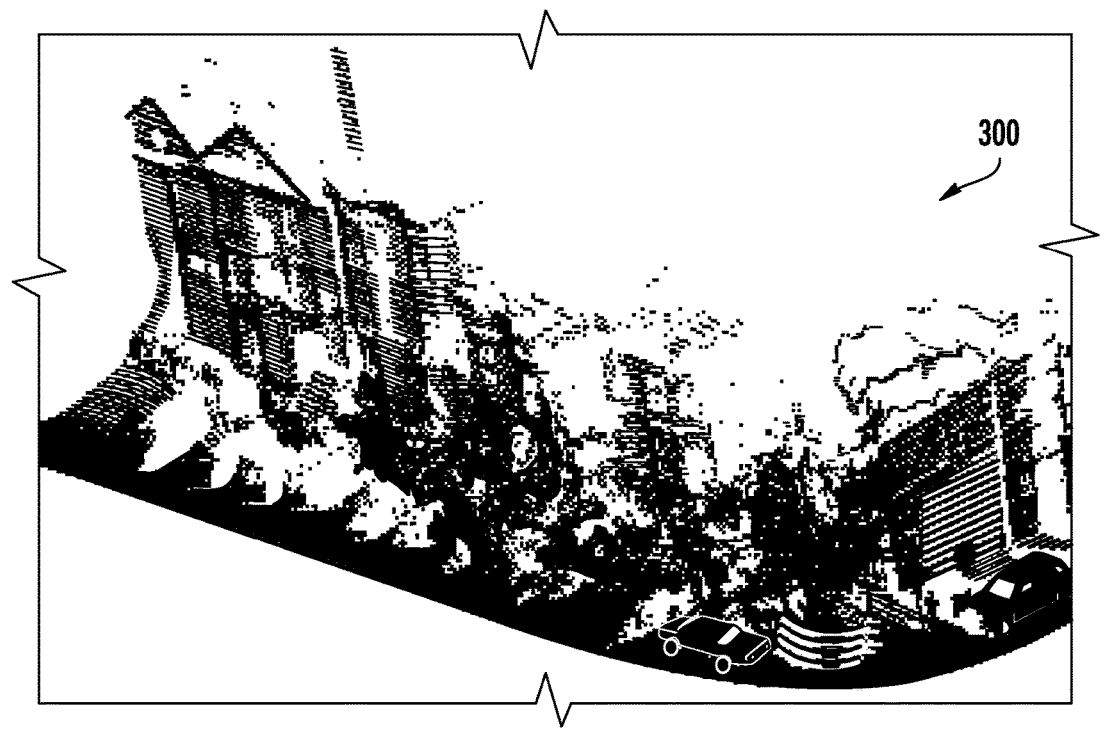
FIG. 3 provides an illustrated full scan view of an input terrestrial LIDAR point cloud according to example aspects of the present disclosure.

FIG. 3 provides an illustrated full scan view of an example cloud 300 of 3D data points acquired along one or more street locations such as received at (202) in method (200) of FIG. 2. The example cloud 300 of 3D data points illustrated in FIG. 3 was obtained via terrestrial LIDAR scanners mounted in a mobile data acquisition unit attached to a vehicle traversing the depicted street location.

Figure 4:
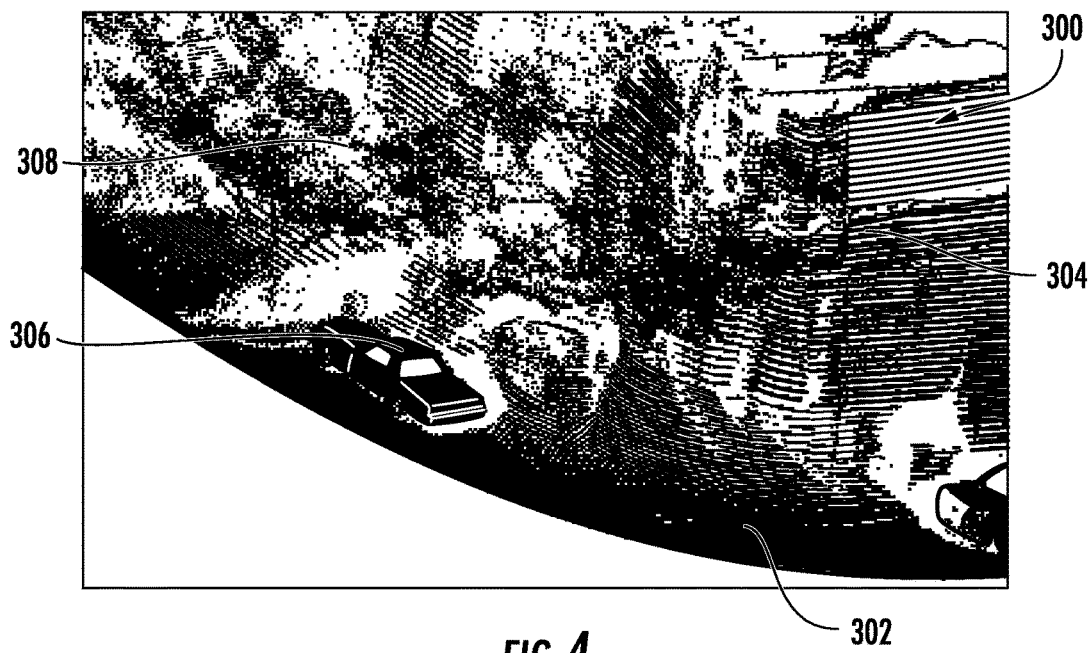
FIG. 4 provides a detailed view of a portion of the input terrestrial LIDAR point cloud illustrated in FIG. 3 according to example aspects of the present disclosure.

FIG. 4 provides a detailed view of the same example cloud 300 of 3D data points as shown in FIG. 3. In FIG. 4, different vertical objects such as curbs 302 and buildings 304 are present within the data set as well as potential occluding objects such as cars 306 and trees 308.

Referring again to FIG. 2, processing of data points within each scanline is generally implemented at (206), whereby curb points are identified within the plurality of vertical scanlines. In some examples, the identification (206) includes classifying each scanline as one of: (i) containing a curb point, (ii) not containing any curb point, or (iii) containing a different vertical object than a curb point. It should be appreciated for category (iii) that when different vertical objects other than a curb point are detected, sometimes those vertical objects will actually hide a curb point (e.g., a car in front of a curb), while other vertical objects may be detected where there is no curb (e.g., the vertical object is part of a building structure behind a parking space were no curb exists.) In some examples, a limitation is implemented whereby each vertical scanline can include no more than one identified curb point and/or other vertical object.

Figure 5:
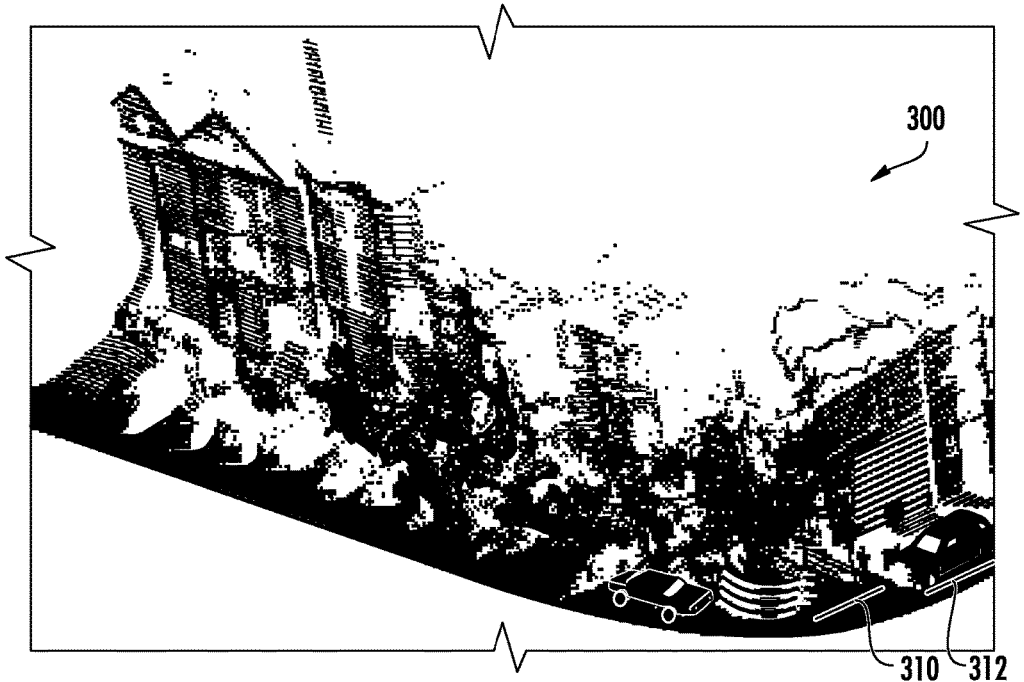
FIG. 5 provides an illustrated view of example curb points and start points for other vertical objects than curbs detected according to example aspects of the present disclosure.

FIG. 5 provides an illustrated view of example curb points 310 that may be identified at (206) in method (200) of FIG. 2. Start points 312 of detected vertical objects other than curbs within the analyzed cloud of 3D data points may also be identified in some vertical scanlines. Often times, if a start point 312 is identified corresponding to a vertical object other than a curb, this vertical object could be effectively hiding a curb point.

Figure 6:
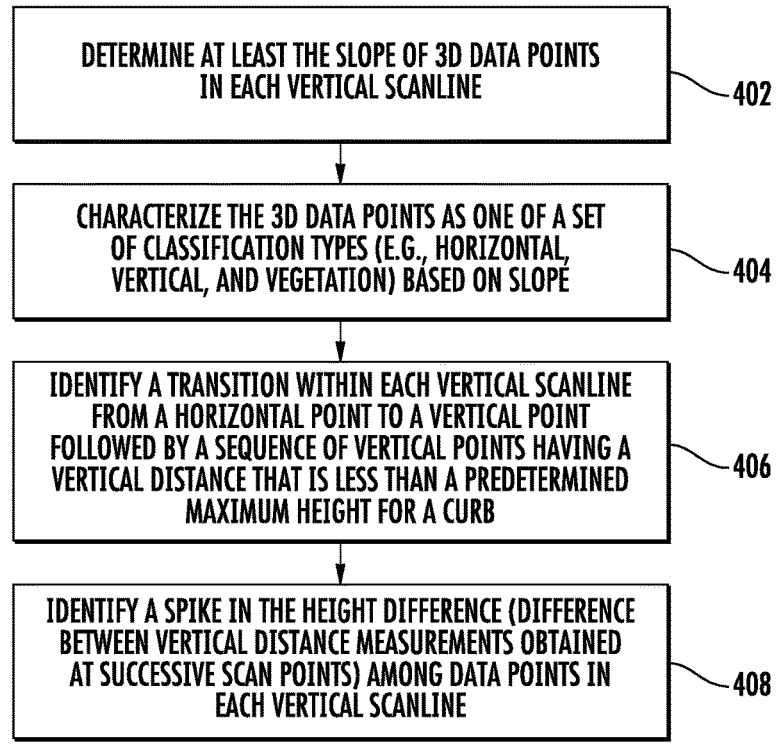
FIG. 6 provides a flow diagram of an example method of identifying curb points in a plurality of vertical scanlines according to example aspects of the present disclosure.

FIG. 6 depicts a flow diagram of one example method (400) of processing the data within each vertical scanline to identify potential curb points according to example aspects of the present disclosure. Various combinations of the steps depicted in method (400) can be used to perform identification of curb points at (206) in FIG. 2. More particularly, the method (400) can include determining at least the slope of each data point in a given scanline (402). In some examples, a sequential classification algorithm is used to compute the slope and signed slope for each 3D point on a vertical scanline. If a vertical scanline is represented as a series P(i) of i points positioned within a sequential vertical array, then the slope of point P(i) on a scanline can be calculated as the angle between the vertical direction and the vector (P(i+1)-P(i)). Based on this determination (402), each of the 3D data points in a vertical scanline can be characterized at (404) as one type from a set of classification types. For example, the set of classification types can include at least horizontal points and vertical points. In another example, the set of classification types can include horizontal points, vertical points and vegetation points.

After the characterization of points in a vertical scanline (404), one or more techniques can be used to analyze the classified data points to more particularly identify curb points. For instance, one technique for more particularly identifying curb points within a vertical scanline can involve identifying a transition within each vertical scanline from a horizontal point to a vertical point followed by a sequence of vertical points having a vertical distance that is less than a predetermined maximum height for a curb (406). If a transition from a horizontal point to a vertical point is followed by a sequence of vertical points having a vertical distance greater than a predetermined height for a curb, then that transition point may be identified as belonging to an object hiding a curb or other than a curb (e.g., a building, pole, car, etc.) In some instances, a curb point may not be identified within a given vertical scanline if the vertical distance after a transition is negative, if there is a high variance between vertical points (e.g., the points are not going up smoothly), or if there are not at least two horizontal points after the vertical part of a detected curb within the scanline.

Another technique for more particularly identifying curb points within a vertical scanline can involve identifying a spike in the height difference among data points in each vertical scanline (408). The height difference (hd(i)), or vertical distance difference, can be represented as the dot product between the unit vertical direction and the vector (P(i+1)-P(i)), where P(i) are the Cartesian coordinates of the $i^{th}$ 3D point on a given vertical scanline.

A noticeable spike in the height difference hd(i) can be a signal for the existence of a curb point. In some examples, spike values can be identified based on a threshold rule, for example, identifying when the height difference value exceeds a predetermined threshold. In other examples, spike values for the height difference can be identified using a moving average window. In moving average window examples, two sliding non-overlapping windows of a given size (e.g., 20 sequential data points in a scanline) are used, and the maximum difference between heights within each window is recorded. A curb point is detected when a window of relatively low difference is followed by a window of relatively high difference.

In some examples, identifying a spike (408) can be enhanced by using an optimal sequential cumulative sum (CUSUM) algorithm to identify potential curb points from spikes in the height difference field hd(i) among data points in a scanline. In such instances, CUSUM algorithms can facilitate robust detection of a change from a low to high height difference value, followed by a change from a high to low height difference value.

In some examples, the method (400) can include a combination of identifying a transition within each vertical scanline (406) and identifying a spike in the height difference (408) to verify potential curb points. For instance, signals can be obtained at (406) and (408) and compared. When signals obtained at (406) and (408) are in agreement, then a potential curb point can be verified. When signals obtained at (406) and (408) are not in agreement, then reconciliation procedures may be employed. For example, if a curb point is detected at (408) but not at (406), then that potential curb point can be verified if and only if either: (a) a transition from horizontal to vertical points within the vertical scanline was not identified at (406); or (b) a transition from horizontal to vertical points was identified at (406) but this transition point corresponds to a different vertical object than a curb and this transition point is not close to the curb point detected at (408). If a curb point is identified at (406) but not at (408), then the potential curb point can be verified. If a curb point is not detected at (408) and a vertical object other than a curb is detected at (406), then the other vertical object can be verified but the curb point may not be verified.

Figure 7:
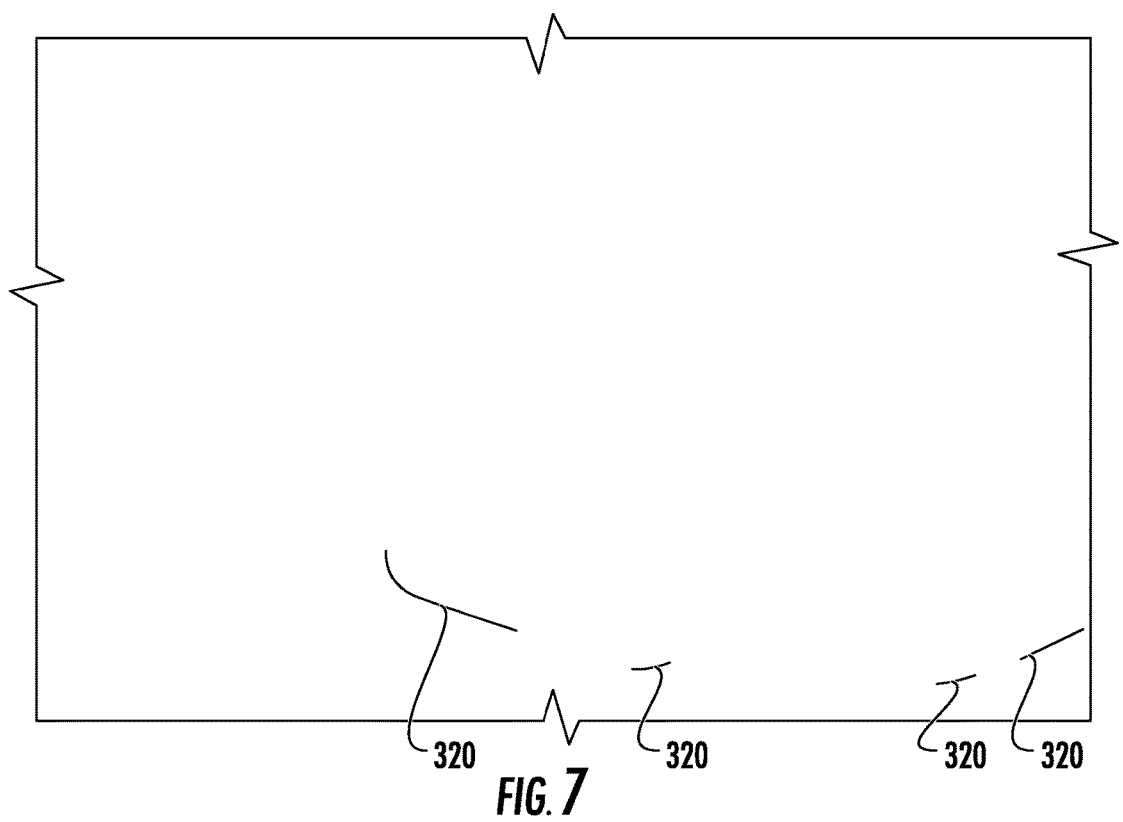
FIG. 7 provides an illustrated view of example detected curb curves generated as part of a synthesized set of non-overlapping curb curves according to aspects of the present disclosure.

Referring again to FIG. 2, once curb points are identified at (206) in one or more of the vertical scanlines, a synthesized set of non-overlapping curb curves is generated at (208) from the identified curb points. FIG. 7 provides an illustrated view of example curb curves 320 generated at (208) by closing the gaps between certain identified curb points and removing certain other curb points as outliers. In some examples, a greedy multi-hypothesis tracking algorithm can be applied to detected curb points in order to connect curb points that are not far away from each other and in order to reject outlier curb points. The output of such a tracking algorithm is a set of non-overlapping curb curves, each consisting of a sequence of identified curb points as well as synthesized curb points that bridge relatively small gaps. In some instances, curb points will not be merged into a curb curve if the synthesized curve that bridges their gap is very close to one of the detected vertical objects other than a curb (e.g., building, car, etc.) identified in (206). This can prevent a synthesized curb curve from being created that would represent a curb as occurring at the same location as a different vertical object.

After generation of curb curves at (208), successive curb curves in the synthesized set of non-overlapping curb curves that belong to the same curb segment within a set of one or more curb segments can be identified at (210). Identifying successive curb curves (210) can involve determining whether two given successive curb curves should be connected. In other words, the gap between each pair of successive curb curves is analyzed to determine whether the gap is a result of an occlusion (for instance, a parked car that hides the curb from the LIDAR sensor) or due to an actual street cut or other break of the curb.

Figure 8:
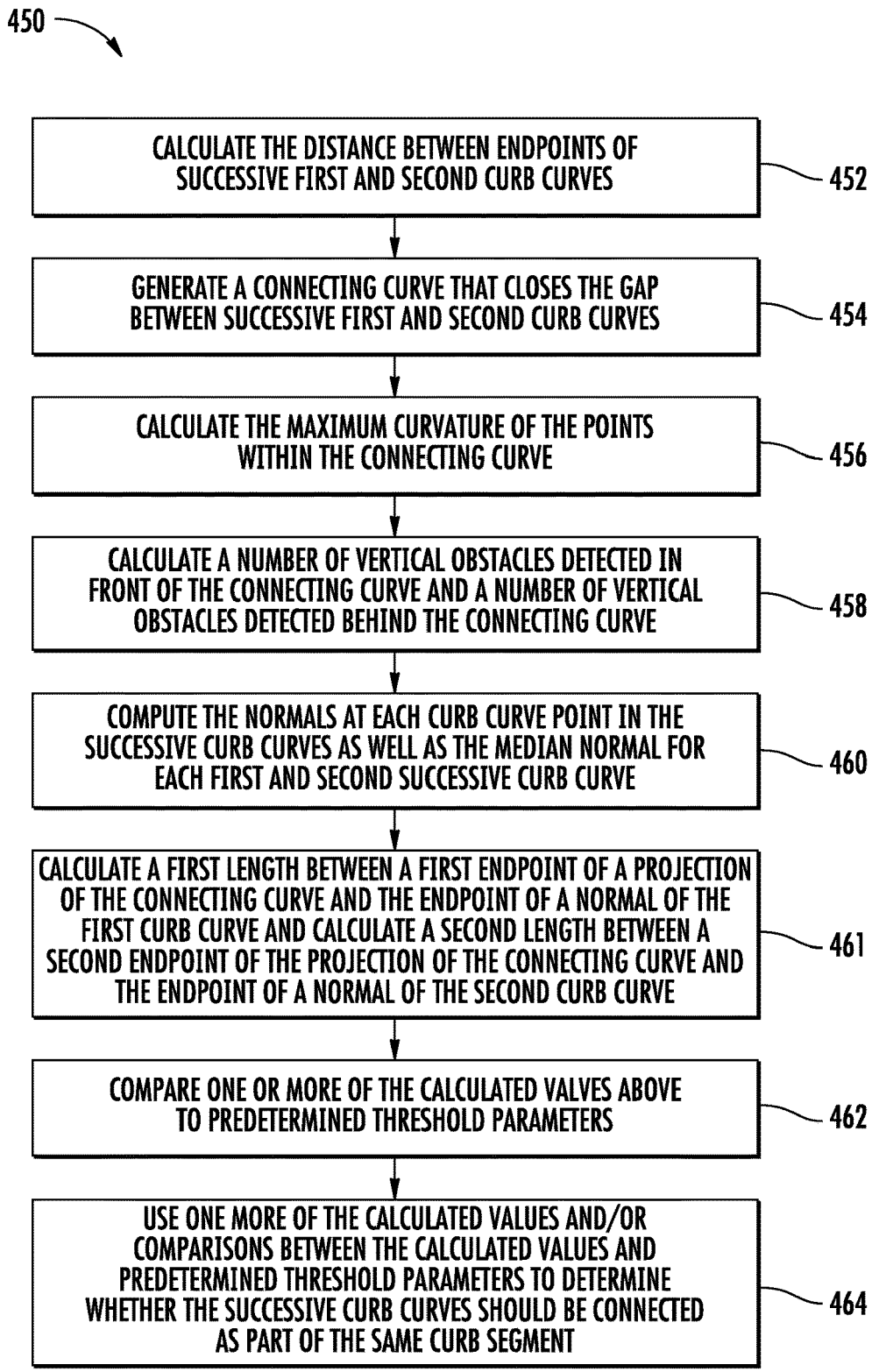
FIG. 8 provides a flow diagram of an example method of identifying successive curb curves that should be connected together as belonging to one or more curb segments.

FIG. 8 generally illustrates a method (450) that describes multiple options that can be employed singularly or in various selectable combinations to implement the identification (210) of successive curb curves belonging to the same curb segment. Although each of the options described relative to FIG. 8 are presented in terms of a single type of calculation (452-461), comparison (462) and determination (464), it should be appreciated that the ultimate determination of whether successive curb curves should be connected as part of the same curb segment can be based on one or more of the calculated values above at (452)-(461), respectively, and/or the outputs of comparing those values with their respective predetermined threshold parameters. In some examples when multiple criteria are used in the determination at (464), some of the criteria can be afforded more weight than others.

In some examples of method (450), the criteria calculated at (452)-(461), respectively, need threshold parameters for comparison (462). For example, predetermined threshold parameter(s) used for comparing (462) can be defined as a function of the distance between endpoints of the first and second curb curves. In some examples, the higher the distance between endpoints, the stricter the thresholds. In some examples, if the distance between endpoints of first and second successive curb curves exceeds a large threshold parameter (e.g., 6*lane width (LW)), then a determination could be made not to connect the first and second curb curves without looking at any of the other possible connection criteria disclosed relative to FIG. 8.

In one example, method (450) includes calculating (452) the distance between endpoints of successive curb curves in the synthesized set of non-overlapping curb curves and comparing (462) the calculated distance (D) between endpoints of successive curb curves to a predetermined curb connection parameter. The curb connection parameter can be a variable that is dependent at least in part on lane width (LW) of the one or more street locations. Predetermined lane width may be custom defined by a user or selectively customized to geographic location, since lane width of streets in the United States, for example, might be different than lane width in Europe, Asia, South America or other locations.

Identifying successive curb curves (210) may variously include combinations of one or more specific comparisons of the distance (D) between endpoints of successive curb curves calculated at (452) to various curb connection parameters at (462). For instance, a first comparison might consider whether the distance (D) is greater than two times the lane width (LW), e.g., whether D>2*LW. A second comparison might consider whether the distance (D) is greater than lane width (LW) while being less than two times the lane width (LW), e.g., whether LW<D<2*LW. A third comparison might consider whether the distance (D) is less than the lane width (LW), e.g., whether D<LW. A combination of these three comparisons might be used in order to decide whether to connect two successive curb curves. In some instances, it will be less likely to connect two segments when the first comparison above is satisfied and progressively more likely to connect two segments together when the second and third comparisons above are satisfied.

Referring still to FIG. 8, another option for identifying (210) successive curb curves that belong to a given curb segment can include generating (454) a connecting curve that closes a gap between successive first and second curb curves. In some examples, the connecting curve generated at (454) is a B-spline curve that is fitted within the gap between the endpoints of the first and second successive curb curves. From the connecting curve generated at (454), other informative variables can be calculated. For example, the maximum curvature of points in the connecting curve can be calculated (456). If the maximum curvature calculated at (456) is high, this can indicate that the connecting curve will have a very rapid transition that does not correspond to a smooth curve. If the maximum curvature is greater than a predetermined threshold parameter, then a decision not to connect the segments can be made.

A further option for identifying (210) successive curb curves that belong to a given curb segment also uses the connecting curve generated at (454). The connecting curve from (454) can be analyzed relative to the starting vertical points detected in each vertical scanline (e.g., the curb points identified at (206) and other vertical points corresponding to vertical objects other than curbs). Consider that each starting vertical point detected in (206) corresponds with a vertical obstacle, such as a curb or other vertical object. The number of vertical obstacles in front of the connecting curve ($N_{front}$) and the number of vertical objects behind the connecting curve ($N_{behind}$) are then calculated at (458). A vertical obstacle is considered to be in front of the connecting curve when the detected start point for that vertical obstacle is in the space between the terrestrial sensor that acquired the data and the simulated location of the connecting curve. If a detected start point for a vertical obstacle is located in the remaining space beyond the connecting curve, then it is considered to be behind the connecting curve. The $N_{front}$ value provides the number of vertical scanlines that may include objects that occlude the curb (cars, for example). The $N_{behind}$ value provides the number of vertical scanlines that include vertical objects behind a possible curb.

In some examples, additional operations can be performed to the $N_{front}$ and $N_{behind}$ values calculated at (458). For instance, $N_{front}$ and $N_{behind}$ can be normalized by dividing them with the number of vertical scanlines that constitute the gap between successive first and second curb curves. This normalization will result in a percentage front ($P_{front}$) value and a percentage back ($P_{back}$) value, both of which can range from 0.0 to 1.0. If the $P_{front}$ value is high and $P_{behind}$ value is low, then that means there are many occluding objects. In such instance, it is possible that a curb lies behind the detected vertical obstacles and a decision to connect the successive first and second curb curves at (464) might be more likely. Similarly, if $P_{front}$ is low and $P_{behind}$ is high, then that means there are relatively few occluding objects and many vertical objects. This situation could correspond, for example, to detecting the entrance of a parking garage in a building where a curb is not detected, but a building is. In this instance, a decision at (464) to connect successive curves at might be less likely. Finally, if $P_{front}$ is low and $P_{behind}$ is low, then a decision at (464) not to connect the curves may be likely because this could indicate open space behind the connective curve. This situation could occur when the scanning vehicle turns and there is a transition from a curb on one block to another curb on a second block. The threshold parameters used for comparing at (462) to the $N_{front}$, $N_{behind}$, $P_{front}$ and/or $P_{behind}$ values to make high/low determinations or other comparisons can be defined in customized ways, and in some examples can be chosen as a function of the distance between endpoints of the first and second curb curves.

Referring still to FIG. 8, another option for identifying (210) successive curb curves that belong to a given curb segment can include computing the normals at each curb curve point and projecting them on the horizontal plane at (460). Considering the example of a straight curb curve, all normals will be approximately the same. For the example of a turning curb curve, the normals will vary smoothly along an almost circular arc. These normals can be computed while curb points are detected at (206) by using the previous and next curb points relative to the current detected one. The median normal can then be identified for each of the two curb successive curb curves. These two medians then can be compared at (462) with the normal of the straight line that closes the gap between the successive curb curves. If there is a relatively big disagreement in the comparison at (462) between each median and the normal of the straight line, then a determination to connect the successive curb curves at (464) may not be likely.

A still further option for identifying (210) successive curb curves that belong to a given curb segment can include calculating first and second lengths at (461) in FIG. 8. The first length is calculated between locations projected on a horizontal plane corresponding to the first endpoint of the connecting curve and the endpoint of a normal of the first curb curve. The second length is calculated between locations projected on a horizontal plane corresponding to the second endpoint of the connecting curve and the endpoint of a normal of the second curb curve. Given an example where both first and second curb curves are straight, and the connecting curve closing the gap between the curb curves is another straight line, then the first and second lengths calculated on the horizontal projection plane will be zero (0). In all other situations, the first and second length will deviate from zero. If the first length and second length values are higher than a predetermined threshold parameter as determined in comparing at (462), then a determination at (464) to connect the curb curves may not be likely. Again, the predetermined threshold parameter used for comparing the first and second length can be chosen in some examples as a function of the distance between endpoints of the first and second curb curves.

Referring again to FIG. 2, method (200) may further include generating a curb model that fits the curb segments from to one or more curb model shape representations (212). Generating a curb model (212) can be conducted on each of the one or more curb segments identified at (210) such that each iteration fits higher-order curb model shape representations to the curb points and corresponding curb curves that are identified as part of the same curb segment. In one example, the different curb model shape representations may include one or more of a 3D linear model, a 3D circular model, a 3D elliptical model and a 3D B-spline model. In some examples, an optimization method is used to identify an optimal set of multiple curb model shape representations to fit the input (e.g., curb points/curves identified as belong in the same curb segment).

Figure 9:
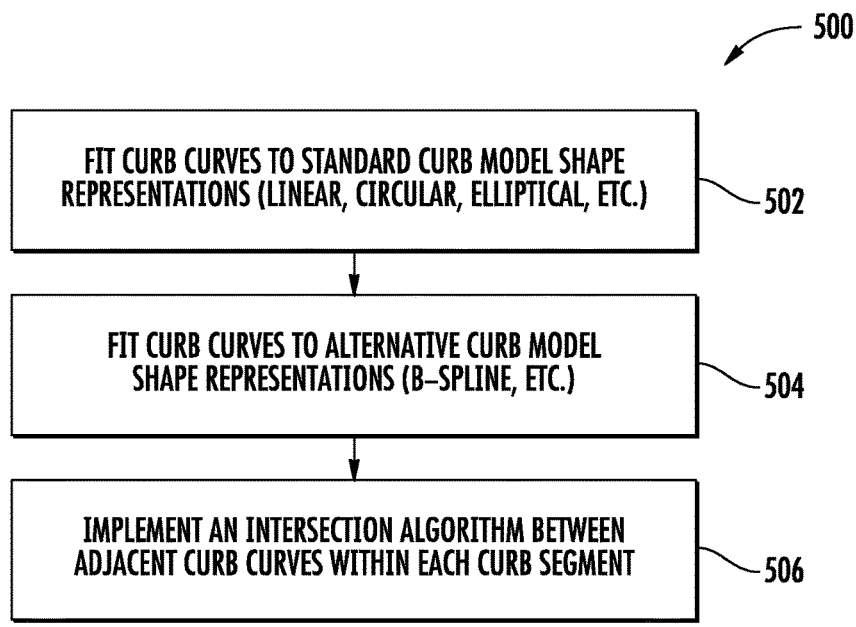
FIG. 9 provides a flow diagram of an example method of generating a curb model according to example aspects of the present disclosure.

In some instances of generating a curb model (212), specific iterations of curve fitting identified in the flow chart of FIG. 9 are implemented. In the example of FIG. 9, a method (500) for generating a curb model includes fitting input curb points/curves at (502) to one or more standard curb model shape representations. Standard curb model shape representations can include, for example, 3D linear model shape representations and/or 3D circular model shape representations and/or 3D elliptical model shape representations. Whenever portions of a given curb segment cannot be fitted at (502) to standard curb model shape representations, such portions can be fitted instead at (504) to one or more alternative curb model shape representations, such as B-spline curb model shape representations. Further implementation can occur at (506) to provide an intersection algorithm for generating the portion of the curb model located between different fitted curb model shape representations. For example, when adjacent curb model shape representations overlap within a given curb segment, implementation of curb intersection algorithm at (506) can help determine how to eliminate that overlap and generate a smooth curve within the curb model at those intersection locations.

By fitting all of the curb points/curves to one or more curb model shape representations, the generating of a curb model (212) can result in a compact representation of each curb segment. Compact representations are afforded because once a fitted model is generated for different portions of each curb segment, the stored curb segment representation need only include the segment endpoints and model definition as opposed to all the many curb points between the endpoints. These compact representations offer benefits such as efficient data storage as well as efficient rendering and processing of the final result.

Figure 10:
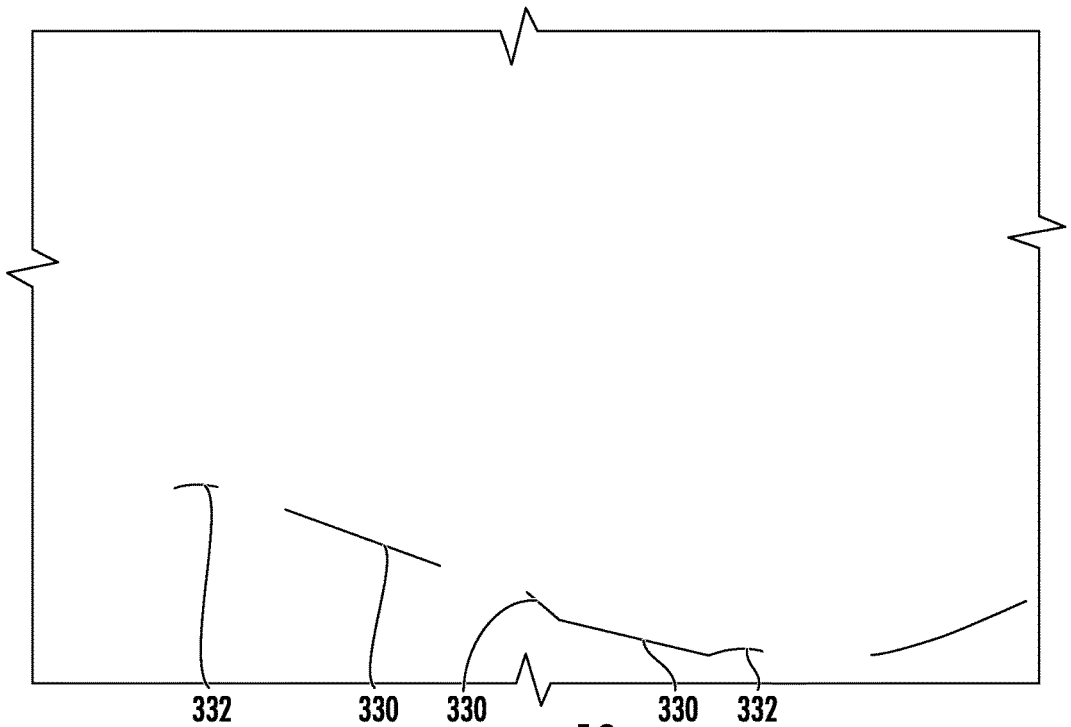
FIG. 10 provides an illustrated view of portions of a generated curb model according to aspects of the present disclosure.
Figure 11:
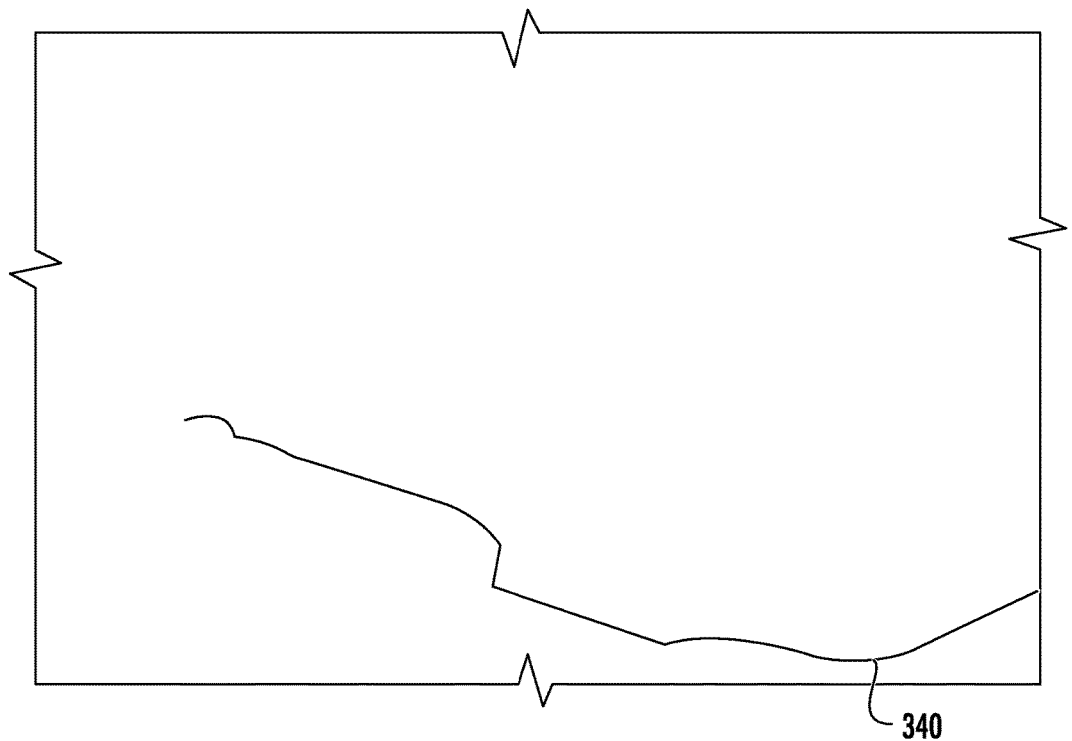
FIG. 11 provides an illustrated view of a final result for an example curb model according to aspects of the present disclosure.

An example generation of curb models (212) is depicted in FIGS. 10 and 11. FIG. 10 provides an illustrated view of portions of a generated curb model that can be included after fitting certain curb curves to standard curb model shape representations including 3D linear models and 3D circular models. In FIG. 10, curb model portions 330 are those portions fitted to a 3D linear model, while curb model portions 332 are those portions fitted to a 3D circular or 3D elliptical model. A final curb model 340 as depicted in FIG. 11 fits the remaining portions of the curb segment other than those fitted in FIG. 10 to alternative curb model shape representations. For instance, curb model 340 can include B-spline models to fit the curb segment between portions 330 and 332 of FIG. 10. Intersection algorithms can be performed in conjunction with one or both of the curb model portion fittings represented by FIGS. 10 and 11.

Figure 12:
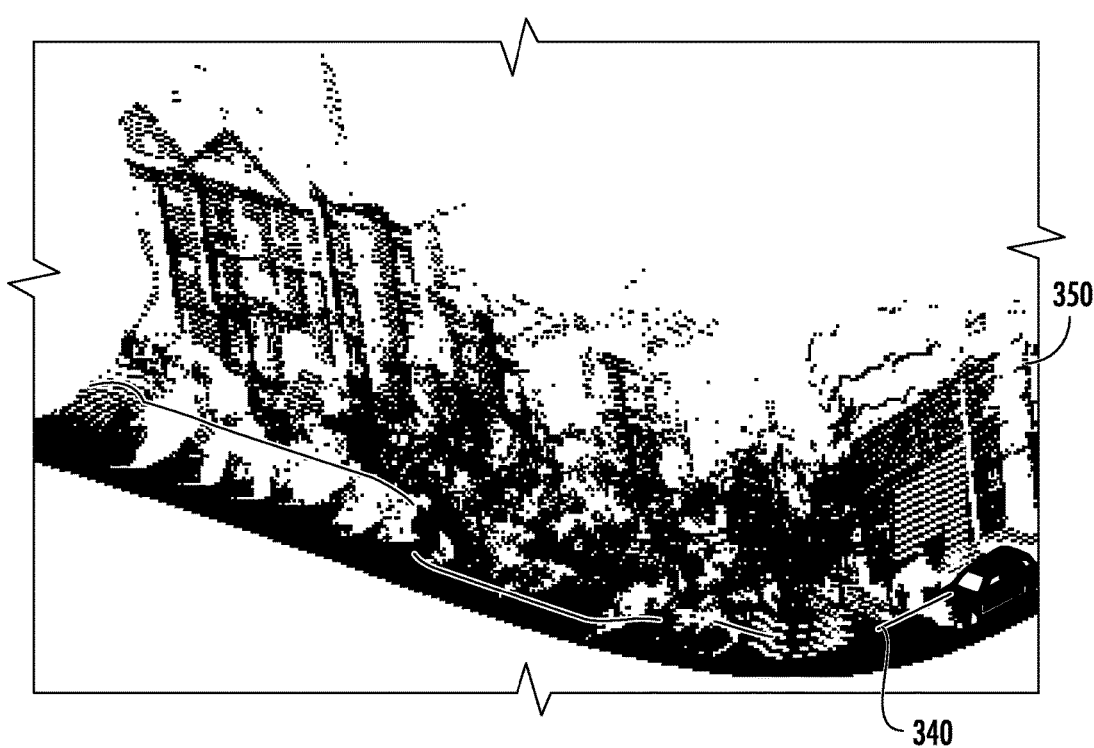
FIG. 12 provides an illustrated view of the example generated curb model of FIG. 11 as part of a generated 3D model based at least in part on the generated curb model.

Referring again to FIG. 2, once a curb model is generated at (212), one or more additional optional applications may happen at (214), (216) and/or (218). In one example, at least one 3D model of the one or more street locations surrounding the modeled curb is generated at (214). The at least one 3D model generated at (214) can be based, at least in part, on the curb model generated at (212). FIG. 12 illustrates the final curb model 340 from FIG. 11 as part of a 3D model 350 based at least in part on the curb model generated at (212).

It should be appreciated that different forms of 3D models may also be generated at (214).

In another example, the curb model generated at (212) and/or the at least one 3D model generated at (214) may be provided for display to a user at (216). In some examples, the curb model and/or at least one 3D model are provided for display to a user in response to a user request to provide such information. For instance, a user of a geographic information system, such as a mapping service or virtual globe application, can request to view a three-dimensional representation of the geographic area. The curb model and/or 3D model can be provided for display, by the geographic information system, as part of the three-dimensional representation of the geographic area.

In a still further example, the curb model can be used at (218) to classify a ground object within the cloud of 3D data points. For instance, when the curb model indicates that a curb is not present (potentially because of a street intersection), an identified ground object might be more likely classified as a traffic light. Similarly, when the curb model indicates that a curb is present, an identified ground object might be more likely classified as a building. Still further application steps than those depicted in FIG. 2 may be employed using the generated curb models and/or 3D models generated in accordance with the disclosed embodiments.

Example Computing Systems for Detecting and Modeling Curb Curves

Figure 13:
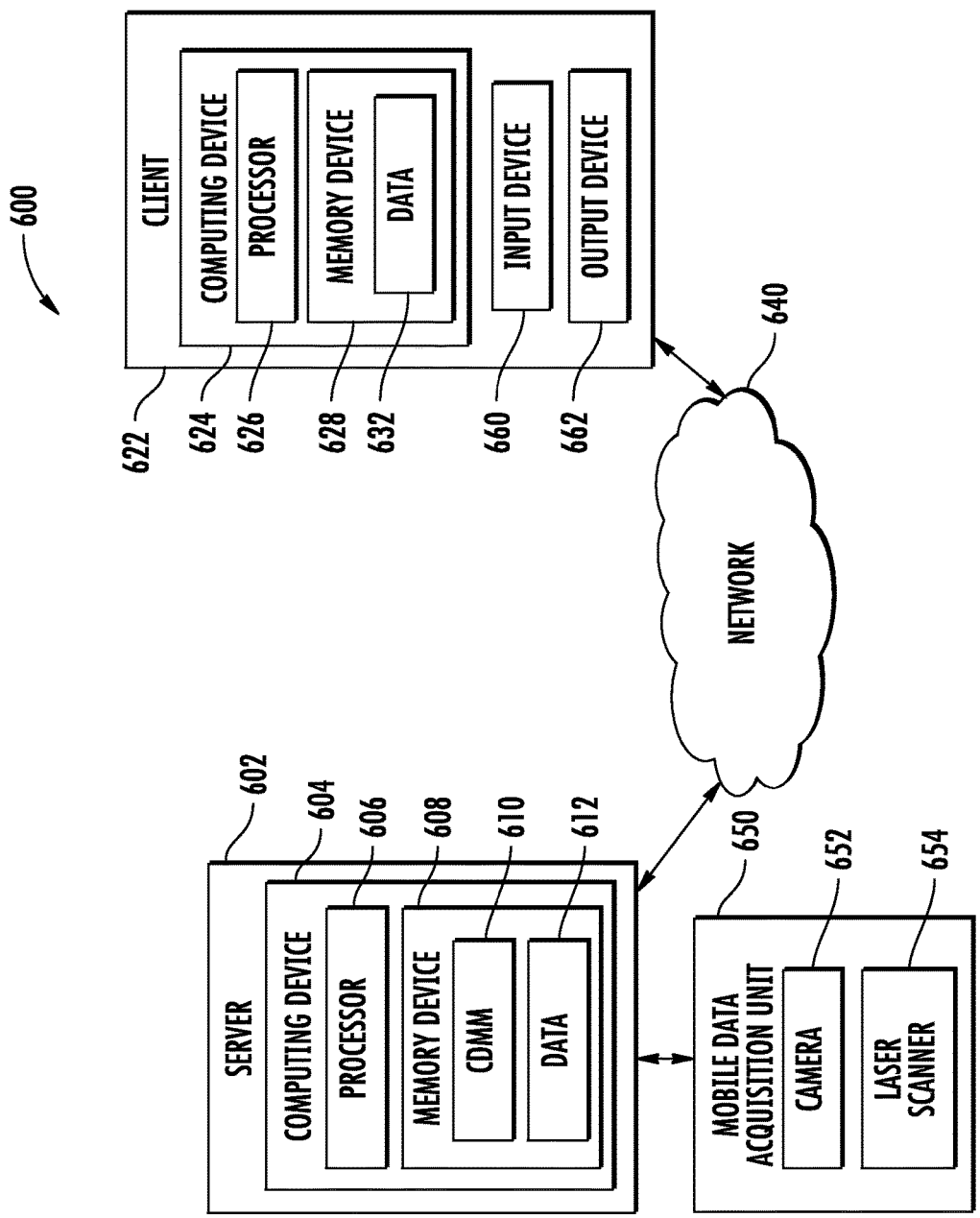
FIG. 13 provides an example overview of system components for implementing a method of detecting and modeling curb curves according to example aspects of the present disclosure.

FIG. 13 depicts a computing system 600 that can be used to implement the methods and systems for detecting and modeling curb curves according to example embodiments of the present disclosure. The system 600 can be implemented using a client-server architecture that includes a server 602 and one or more clients 622. Server 602 may correspond, for example, to a web server hosting a geographic information system and/or a three-dimensional mapping/modeling system. Client 622 may correspond, for example, to a personal communication device such as but not limited to a smartphone, navigation system, laptop, mobile device, tablet, wearable computing device or the like.

Each server 602 and client 622 can include at least one computing device, such as depicted by server computing device 604 and client computing device 624. Although only one server computing device 604 and one client computing device 624 is illustrated in FIG. 13, multiple computing devices optionally may be provided at one or more locations for operation in sequence or parallel configurations to implement the disclosed methods and systems of detecting and modeling curb curves. In other examples, the system 600 can be implemented using other suitable architectures, such as a single computing device. Each of the computing devices 604, 624 in system 600 can be any suitable type of computing device, such as a general purpose computer, special purpose computer, navigation system (e.g. an automobile navigation system), laptop, desktop, mobile device, smartphone, tablet, wearable computing device, a display with one or more processors, or other suitable computing device.

The computing devices 604 and/or 624 can respectively include one or more processor(s) 606, 626 and one or more memory devices 608, 628. The one or more processor(s) 606, 626 can include any suitable processing device, such as a microprocessor, microcontroller, integrated circuit, logic device, one or more central processing units (CPUs), graphics processing units (GPUs) dedicated to efficiently rendering images or performing other specialized calculations, and/or other processing devices. The one or more memory devices 608, 628 can include one or more computer-readable media, including, but not limited to, non-transitory computer-readable media, RAM, ROM, hard drives, flash drives, or other memory devices. In some examples, memory devices 608, 628 can correspond to coordinated databases that are split over multiple locations.

The one or more memory devices 608, 628 store information accessible by the one or more processors 606, 626, including instructions that can be executed by the one or more processors 606, 626. For instance, server memory device 608 can store instructions for implementing a curb detection and modeling module (CDMM) 610. The curb detection and modeling module (CDMM) 610 can be configured to perform various functions disclosed herein. The client memory device 628 can store instructions for implementing a browser or module that allows a user to request information from server 602.

The one or more memory devices 608, 628 can also include data 612, 632 that can be retrieved, manipulated, created, or stored by the one or more processors 606, 626. The data 612 stored at server 602 can include, for instance, clouds of 3D data points that are provided as input in the disclosed embodiments for curb detection and modeling. In some embodiments, data 612 is obtained by a mobile data acquisition unit 650 that is communicatively connected to server 602. Mobile data acquisition unit 650 can include one or more data sensors for gathering 3D data points, such as but not limited to camera 652 configured to obtain series of 2D images and/or laser scanner 654 configured to obtain 3D terrestrial LIDAR data.

Computing devices 604 and 624 can communicate with one another over a network 640. In such instances, the server 602 and one or more clients 622 can also respectively include a network interface used to communicate with one another over network 640. The network interface(s) can include any suitable components for interfacing with one more networks, including for example, transmitters, receivers, ports, controllers, antennas, or other suitable components. The network 640 can be any type of communications network, such as a local area network (e.g. intranet), wide area network (e.g. Internet), cellular network, or some combination thereof. The network 640 can also include a direct connection between server computing device 604 and client computing device 624. In general, communication between the server computing device 604 and client computing device 624 can be carried via network interface using any type of wired and/or wireless connection, using a variety of communication protocols (e.g. TCP/IP, HTTP, SMTP, FTP), encodings or formats (e.g. HTML, XML), and/or protection schemes (e.g. VPN, secure HTTP, SSL).

The client 622 can include various input/output devices for providing and receiving information to/from a user. For instance, an input device 660 can include devices such as a touch screen, touch pad, data entry keys, and/or a microphone suitable for voice recognition. Input device 660 can be employed by a user to identify street locations or curbs to analyze in accordance with the disclosed embodiments, or to request the display of different models generated in accordance with the disclosed embodiments. An output device 662 can include audio or visual outputs such as speakers or displays for providing curb model outputs and/or 3D model outputs including the curb model output or output classifications using the curb model outputs. Audio and/or visual alarms could also be provided at output device 662 to provide signals to a user indicating the presence or absence of a curb.

It will be appreciated that the term "module" refers to computer logic utilized to provide desired functionality. Thus, a module can be implemented in hardware, application specific circuits, firmware and/or software controlling a general purpose processor. In one embodiment, the modules are program code files stored on the storage device, loaded into one or more memory devices and executed by one or more processors or can be provided from computer program products, for example computer executable instructions, that are stored in a tangible computer-readable storage medium such as RAM, flash drive, hard disk, or optical or magnetic media. When software is used, any suitable programming language or platform can be used to implement the module.

The technology discussed herein makes reference to servers, databases, software applications, and other computer-based systems, as well as actions taken and information sent to and from such systems. One of ordinary skill in the art will recognize that the inherent flexibility of computer-based systems allows for a great variety of possible configurations, combinations, and divisions of tasks and functionality between and among components. For instance, server processes discussed herein may be implemented using a single server or multiple servers working in combination. Databases and applications may be implemented on a single system or distributed across multiple systems. Distributed components may operate sequentially or in parallel.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A computer-implemented method of detecting curbs, comprising:
   receiving, by one or more computing devices, a cloud of three-dimensional data points acquired along one or more street locations;
   identifying, by the one or more computing devices, a plurality of vertical scanlines within the cloud of three-dimensional data points, each vertical scanline comprising an array of three-dimensional data points obtained at a given horizontal location along the one or more street locations;
   identifying, by the one or more computing devices, one or more curb points in at least one of the plurality of vertical scanlines, wherein the one or more curb points are indicative of the potential presence of a curb along the one or more street locations; and
   generating, by the one or more computing devices, a curb model of the curb based at least in part on the one or more curb points.

2. The computer-implemented method of claim 1, wherein receiving, by the one or more computing devices, the cloud of three-dimensional data points comprises receiving, by the one or more computing devices, the cloud of three-dimensional LIDAR data points acquired by a LIDAR system along the one or more street locations.

3. The computer-implemented method of claim 1, wherein identifying, by the one or more computing devices, the one or more curb points in at least one of the plurality of vertical scanlines comprises:
   determining, by the one or more computing devices, at least one of a slope and a height difference for each of one or more data points included in the vertical scanline based at least in part on a vector describing a spatial difference between such data point and a next sequential data point; and
   identifying, by the one or more computing devices, the one or more curb points by identifying changes in the slope or height difference of the one or more data points included in the vertical scanline.

4. The computer implemented method of claim 1, wherein generating, by the one or more computing devices, the curb model comprises:
   generating, by the one or more computing devices, a synthesized set of non-overlapping curb curves based at least in part on the one or more curb points identified in nearby vertical scanlines to close gaps between one or more of the curb points.

5. The computer-implemented method of claim 4, wherein generating, by the one or more computing devices, the synthesized set of non-overlapping curb curves comprises connecting together, by the one or more computing devices, one or more pairs of curb points that are within a predetermined distance from each other.

6. The computer-implemented method of claim 4, wherein generating, by the one or more computing devices, the curb model further comprises:
   identifying, by the one or more computing devices, successive curb curves in the synthesized set of non-overlapping curb curves as belonging to one or more curb segments.

7. The computer-implemented method of claim 6, wherein identifying, by the one or more computing devices, the successive curb curves as belonging to one or more curb segments comprises:
   determining, by the one or more computing devices, a respective distance between endpoints of each pair of successive curb curves; and
   comparing, by the one or more computing devices, the respective distance between the endpoints of each pair of successive curb curves to a predetermined curb connection parameter.

8. The computer-implemented method of claim 7, wherein the predetermined curb connection parameter is a variable dependent at least in part on a lane width of streets associated with the one or more street locations.

9. The method of claim 6, wherein identifying, by the one or more computing devices, successive curb curves in the synthesized set of non-overlapping curb curves as belonging to one or more curb segments comprises:
   generating a connecting curve that closes a gap between successive curb curves;
   calculating a number of vertical obstacles detected in front of the connecting curve and a number of vertical obstacles detected behind the connecting curve; and
   determining whether the successive curb curves should be connected as part of the same curb segment based at least in part on the number of vertical obstacles detected in front of the connecting curve and the number of vertical obstacles detected behind the connecting curve.

10. The computer-implemented method of claim 6, wherein generating, by the one or more computing devices, the curb model further comprises:
    fitting, by the one or more computing devices, each of the one or more curb segments to one or more curb model shape representations to generate the curb model.

11. The computer-implemented method of claim 1, further comprising:
using, by the one or more computing devices, the generated curb model to classify a ground object within the cloud of three-dimensional data points.

12. The computer-implemented method of claim 1, further comprising:
using, by the one or more computing devices, the generated curb model to provide real-time navigational information.

13. A computing system, comprising:
one or more processors; and
one or more memory devices, the one or more memory devices storing computer-readable instructions that when executed by the one or more processors, cause the one or more processors to perform operations, the operations comprising:
receiving a cloud of three-dimensional data points acquired along one or more street locations;
identifying a plurality of vertical scanlines within the cloud of three-dimensional data points, each vertical scanline comprising an array of three-dimensional data points obtained at a given horizontal location along the one or more street locations;
identifying one or more curb points in the plurality of vertical scanlines, wherein the one or more curb points are indicative of the potential presence of a curb along the one or more street locations;
generating a curb model of the curb based at least in part on the one or more curb points; and
generating a three-dimensional model of the one or more street locations based at least in part on the generated curb model.

14. The computing system of claim 13, wherein the operation of identifying one or more curb points in the plurality of vertical scan lines comprises:
determining the slope of three-dimensional data points and characterizing the three-dimensional data points as one of a predetermined set of classification types including at least horizontal points and vertical points based at least in part on the determined slope;
identifying a transition within each vertical scanline from a horizontal point to a vertical point followed by a sequence of vertical points having a vertical distance that is less than a predetermined maximum height for a curb; and
identifying a spike in the height difference among data points in each vertical scanline, wherein the height difference is calculated as the difference between vertical distance measurements obtained at successive scan points in each vertical scanline.

15. The computing system of claim 13, wherein the operation of generating the curb model of the curb comprises calculating a distance between endpoints of successive curb curves in a synthesized set of non-overlapping curb curves and comparing the calculated distance between endpoints to a predetermined curb connection parameter that is dependent at least in part on lane width of the one or more street locations.

16. The computing system of claim 13, wherein the operation of generating the curb model of the curb comprises one or more of:
generating a connecting curve that closes a gap between successive first and second curb curves;
determining a number of vertical obstacles detected in front of the connecting curve and a number of vertical obstacles detected behind the connecting curve;
determining whether the first and second successive curb curves should be connected as part of the same curb segment based at least in part on the number of vertical obstacles detected in front of the connecting curve and the number of vertical obstacles detected behind the connecting curve.

17. One or more tangible, non-transitory computer-readable media storing computer-readable instructions that when executed by one or more processors cause the one or more processors to perform operations, the operations comprising:
receiving a cloud of three-dimensional data points acquired along one or more street locations;
identifying a plurality of vertical scanlines within the cloud of three-dimensional data points, each vertical scanline comprising an array of three-dimensional data points obtained at a given horizontal location along the one or more street locations;
identifying one or more curb points in the plurality of vertical scanlines, wherein the one or more curb points are indicative of the potential presence of a curb along the one or more street locations;
generating a curb model of the curb based at least in part on the one or more curb points.

18. The one or more tangible, non-transitory computer-readable media of claim 17, wherein the operation of identifying the one or more curb points in the plurality of vertical scan lines comprises:
determining, by the one or more computing devices, at least one of a slope and a height difference for each of one or more data points included in at least one vertical scanline based at least in part on a vector describing a spatial difference between such data point and a next sequential data point; and
identifying, by the one or more computing devices, the one or more curb points by identifying changes in the slope or height difference of the one or more data points included in the vertical scanline.

19. The one or more tangible, non-transitory computer-readable media of claim 17, wherein the operation of identifying the one or more curb points in the plurality of vertical scan lines comprises:
determining the slope of three-dimensional data points and characterizing the three-dimensional data points as one of a predetermined set of classification types including at least horizontal points and vertical points based at least in part on the determined slope;
identifying a transition within each vertical scanline from a horizontal point to a vertical point followed by a sequence of vertical points having a vertical distance that is less than a predetermined maximum height for a curb; and
identifying a spike in the height difference among data points in each vertical scanline, wherein the height difference is calculated as the difference between vertical distance measurements obtained at successive scan points in each vertical scanline.

20. The one or more tangible, non-transitory computer-readable media of claim 17, wherein the operation of generating the curb model of the curb based at least in part on the one or more curb points comprises comparing a calculated value for each of one or more pairs of first and second successive curb curves to a predetermined threshold parameter dependent at least in part on the distance between endpoints of the first and second successive curb curves.

* * * * *